United States Patent [19]

Katz

[11] Patent Number: 5,889,230

[45] Date of Patent: Mar. 30, 1999

[54] ASSEMBLY FOR ATTENUATING ELECTROMAGNETIC RADIATION EMITTED FROM PORTABLE ELECTRONIC DEVICES

[76] Inventor: Joseph M. Katz, 11 Meadow Rd., Old Westbury, N.Y. 11568

[21] Appl. No.: 782,813

[22] Filed: Jan. 13, 1997

Related U.S. Application Data

[60] Provisional application No. 60/010,691 Jan. 26, 1996.

[51] Int. Cl.⁶ ...................................................... H05K 9/00

[52] U.S. Cl. .......................................... 174/35 R; 361/816

[58] Field of Search ................................. 174/35 R, 52.1; 361/816, 818, 679, 752, 753, 799, 800, 680, 683; 364/708.1

[56] References Cited

U.S. PATENT DOCUMENTS

| | | | |
|---|---|---|---|
| 4,091,232 | 5/1978 | Lenk et al. | 174/52.1 |
| 5,134,245 | 7/1992 | Katz | 174/35 R |
| 5,336,848 | 8/1994 | Katz | 174/35 R |
| 5,426,562 | 6/1995 | Morehouse et al. | 361/685 |
| 5,550,712 | 8/1996 | Crockett | 361/752 |

*Primary Examiner*—Kristine Kincaid
*Assistant Examiner*—Hung V. Ngo
*Attorney, Agent, or Firm*—Dilworth & Barrese

[57] ABSTRACT

An assembly for attenuating electromagnetic radiation emitted from portable electronic devices is provided which includes a tray having a base with upright sides, the sides and base provided with electromagnetic radiation shielding, a cushion disposed within the base, and a slip resistant member affixed to the under side of the base.

3 Claims, 1 Drawing Sheet

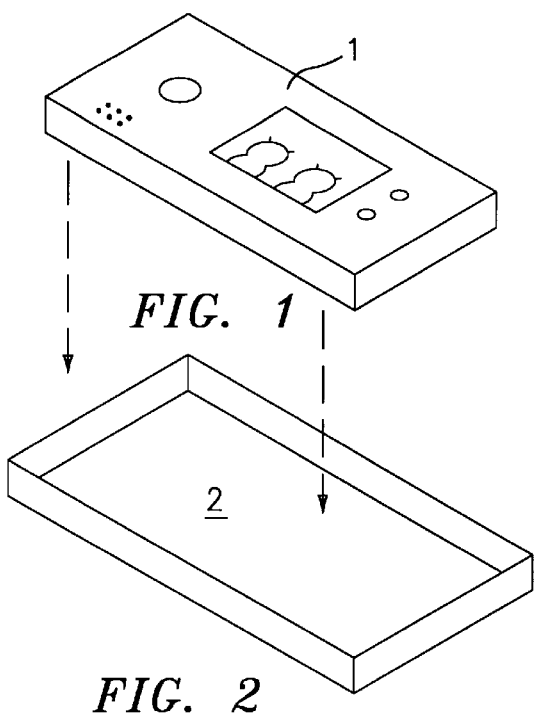
FIG. 1
FIG. 2
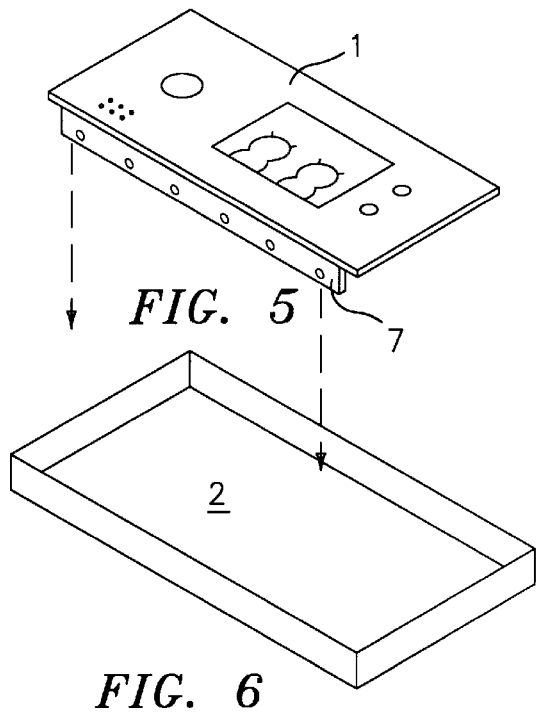
FIG. 5
FIG. 6
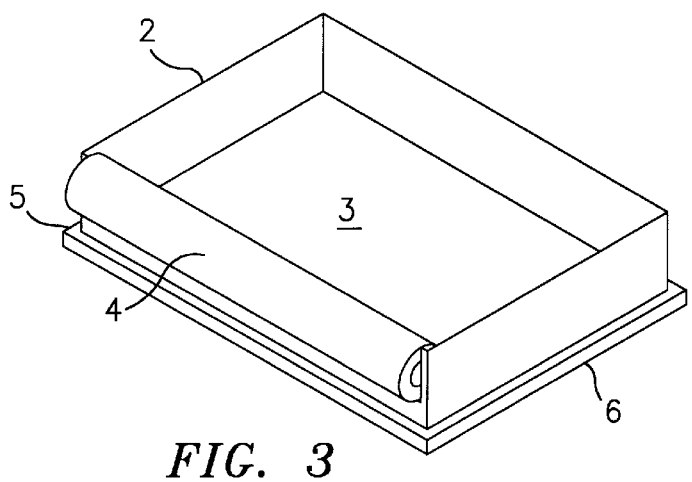
FIG. 3
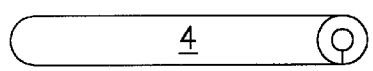
FIG. 4

ASSEMBLY FOR ATTENUATING ELECTROMAGNETIC RADIATION EMITTED FROM PORTABLE ELECTRONIC DEVICES

BACKGROUND OF THE INVENTION

1. Field of the invention

The invention relates to providing some protection to the users of portable computer video games from the electromagnetic radiation emitted therefrom and to provide a comfortable resting place when in use.

2. Description of the prior art

Lap-top Computer Operators Protective Device by Joseph M. Katz Patents No. 5,336,848 Aug. 9, 1994 and No. 5,134,245 Jul. 28, 1992.

3. Provisional Patent Application Ser. No. 60/010,691, Filing Date Jan. 26, 1996, with Foreign Filing License Granted Mar. 19, 1996, Title "PORTABLE VIDEO PROTECTIVE DEVICE", respectfully requested to be used for the filing date of this patent application.

SUMMARY OF THE INVENTION.

There is much concern throughout the world that electromagnetic radiation from computers and video devices used over a period of time may cause gene defects, cancer, leukemia and brain damage if the devices are placed close to the body, when in use.

There is a big market for small portable computer video games sold to children and young adults for amusement purposes. They are small combination computer-video devices operated on battery power, some with changeable program cartridges. When in use they emit electromagnetic radiation. In use they are hand-held, close to the body. They are also used on the child's lap close to their body genes.

Upon seeing these video games in use and that they are held so close to the body and to the reproductive parts of the body the inventor tested a "Sega Game Gear" color portable video game system for electromagnetic radiation and discovered electromagnetic radiation emitting therefrom.

The inventor realizing that a girl child is born with all of her eggs for her lifetime became concerned that the use of a portable video-computer game emitting electro-magnetic radiation might cause mutations in her eggs and not be discovered until she gave birth to a mutated baby years and years later on, thereby destroying her life also the life of an otherwise normal child and the vexations and problems that go with a mutated child in a family.

The inventor, upon discovering this problem, realized the grave potentials to youths, especially girls, using video-computer games that emitted electro-magnetic radiation and therefore invented this protective device to reduce the emitted electromagnetic radiation from portable video games hoping to save girls eggs from mutations, gene damage, cancer, leukemia, alzheimers disease, etc., caused by uncontrolled electro magnetic radiation emmissions.

The purpose of the invention is to reduce the electromagnetic radiation emitted from the black and white and the color video-computer games thereby affording some protection against possible body; gene and egg damage.

The name of the invention will be "GAME-PROTECT".

The invention is to serve 3 purposes:

No. 1 is to provide adequate EMI shielding for newly manufactured video-computer games.

No. 2 is an accessory for video game computers already on the market or in use which provides an EMI shielded tray to place the video computer game into when in use.

No. 3 is a broader version accessory for the video game computer which expands the No. 2 version, to afford in addition to the EMI shielding, a bumper to protect against inadvertent bangs and bumps, a vibration absorbing cushion for the video computer game to rest upon and a slip resistant bottom cushion to protect against slips and slides when using on an airplane chair tray or on the users lap or other surface.

The invention is simple to install and use, all that is required is to place the video computer game into the invention's EMI shielded tray, turn on the video computer game and it is ready to use. The EMI shielding automatically attenuates the emitted radiation.

There are many forms of EMI shielding on the market today that do not require grounding which will be used in the manufacturing of the invention.

BRIEF DESCRIPTION OF THE DRAWINGS

FIG. 1 is a portable computer video game.

FIG. 2 is an EMI shielded tray.

FIG. 3 is an EMI shielded tray with a shock absorbing cushion, a removable wrist rest, a bumper and a slip resistant bottom cushion.

FIG. 4 is a portable removable wrist and body rest.

FIG. 5 is a computer video game without the bottom case.

FIG. 6 is an EMI shielded bottom case for the portable computer video game. 1 is the portable computer video game. 2 is the EMI shielded tray. 3 is the shock absorbing cushion for the game to rest upon. 4 is the removable wrist and body rest. 5 is the bumper. 6 is the slip resistant bottom cushion. 7 is the computer-video game without a bottom case.

DESCRIPTION OF THE PREFERRED EMBODIMENTS

The invention consists of:

Model No. 1.

A formed tray having 4 sides and a bottom. All sides and the bottom will be shielded with EMI shielding to attenuate the EMI radiated emmissions. This tray will be the bottom and sides for the video computer game when it is manufactured. Since video computer games come in various sizes and shapes, various sizes and shapes of trays will be manufactured to fit the different types and sizes.

Model No. 2.

A formed tray having 4 sides and a bottom with EMI shielding to attenuate the EMI radiated emissions will be manufactured in different sizes and shapes to accomodate the various video computer games in use.

All that is required to use will be for the video computer game user to insert the video computer game into the EMI shielded tray, turn on the video computer game and use it. The EMI shielded tray will automatically attenuate the EMI radiation.

Model No. 3.

Will be the same as Model No. 2 with the following added features attached to the formed tray to become a one piece unit.

A foam type blanket firmly affixed on the entire top of the bottom of the tray for a vibration and sound absorber when the video computer game is placed into the tray.

On the outside of the tray at the bottom and around all of the sides will be affixed a small foam or rubber extension for a bumper.

A slip resistant rubber padding will be installed on the entire bottom side of the tray to protect against slipping and sliding when the video computer game is placed on a surface.

A separate round hollowed foam strip with one knife cut along its entire length will be provided with the tray that can easily slide on or off the front or rear side of the tray. Its purpose is to provide a removable wrist rest for the computer game user or to be a used as a bumper shield against the body of the user.

While various changes may be made in the detailed construction, such changes will be within the spirit and scope of the present invention.

I claim:

1. An assembly for attenuating electromagnetic radiation emitted from portable video games, also included in assembly is a vibration and sound absorber, a bumper, a slip resistant base and a portable wrist rest, said assembly comprising:

a) a formed tray having a base with upright sides, the upright sides and base affixed with electromagnetic radiation shielding;

b) a horizontal vibration and sound absorbent cushion affixed to an upper side of the base of the tray;

c) a horizontal slip resistant cushion affixed to an under side of the base of the tray;

d) a bumper affixed around the upright sides of the base of the tray; and e) a portable wrist rest and body bumper shield of round hollow foam strip, the wrist rest defining a cut formed along its entire length, to slide on and off at least one of the upright sides of the tray.

2. The assembly for attenuating electromagnetic radiation according to claim 1, wherein the slip resistant cushion is rubber padding.

3. The assembly for attenuating electromagnetic radiation according to claim 1, wherein the bumper is configured and dimensioned to permit the bumper to slide on and off the at least one upright side of the tray.

* * * * *